(12) United States Patent
Moler

(10) Patent No.: US 8,669,691 B2
(45) Date of Patent: Mar. 11, 2014

(54) SMALL SCALE SMART MATERIAL ACTUATOR AND ENERGY HARVESTING APPARATUS

(75) Inventor: Jeffery B Moler, Sarasota, FL (US)

(73) Assignee: Viking AT, LLC, Sarasota, FL (US)

( * ) Notice: Subject to any disclaimer, the term of this patent is extended or adjusted under 35 U.S.C. 154(b) by 30 days.

(21) Appl. No.: 13/203,729

(22) PCT Filed: Jul. 9, 2010

(86) PCT No.: PCT/US2010/041461
§ 371 (c)(1),
(2), (4) Date: Aug. 28, 2011

(87) PCT Pub. No.: WO2011/006028
PCT Pub. Date: Jan. 13, 2011

(65) Prior Publication Data
US 2011/0309721 A1 Dec. 22, 2011

Related U.S. Application Data

(60) Provisional application No. 61/224,596, filed on Jul. 10, 2009.

(51) Int. Cl.
H01L 41/08 (2006.01)
(52) U.S. Cl.
USPC .......................................... 310/339; 310/328
(58) Field of Classification Search
USPC ....................................................... 310/328
See application file for complete search history.

(56) References Cited

U.S. PATENT DOCUMENTS

| | | | |
|---|---|---|---|
| 4,435,666 A * | 3/1984 | Fukui et al. | 310/328 |
| 4,442,372 A | 4/1984 | Roberts | |
| 4,518,887 A * | 5/1985 | Yano et al. | 310/328 |
| 4,547,086 A * | 10/1985 | Matsumoto et al. | 400/124.16 |
| 4,570,095 A * | 2/1986 | Uchikawa | 310/328 |
| 4,633,120 A * | 12/1986 | Sato et al. | 310/328 |
| 5,751,091 A | 5/1998 | Takahashi et al. | |
| 5,828,157 A | 10/1998 | Miki et al. | |
| 6,046,526 A * | 4/2000 | Maruyama | 310/323.06 |
| 6,513,213 B1 | 2/2003 | Muramatsu et al. | |
| 6,520,479 B1 | 2/2003 | Sato | |
| 6,548,938 B2 | 4/2003 | Moler et al. | |
| 6,717,332 B2 * | 4/2004 | Moler et al. | 310/328 |

(Continued)

FOREIGN PATENT DOCUMENTS

| | | |
|---|---|---|
| JP | 2005-149679 | 6/2005 |
| JP | 2005-302711 | 10/2005 |
| JP | 2006-138913 | 6/2006 |

*Primary Examiner* — Mark Budd
(74) *Attorney, Agent, or Firm* — William G. Giltinan; Carlton Fields Jorden Burt, PA

(57) ABSTRACT

A micro-scale, smart material actuator having an overall length smaller than 10 mm comprising a multilayer piezoelectric stack housed in a mechanical amplifier made up of a fixed supporting member, a movable supporting member connected to compliant links attached to one or more actuating arms such that, when a suitable electric current is applied to the piezoelectric stack, the resulting expansion is translated through the movable supporting member, thereby causing movement in the actuating arms A method of generating electricity from motion using such an actuator is also disclosed in which the actuating arms are connected to a source of mechanical motion and the piezoelectric stack is connected to an electrical load, whereby the mechanical motion causes the piezoelectric stack to generate electrical charge that is then discharged into the load.

8 Claims, 3 Drawing Sheets

(56) References Cited

U.S. PATENT DOCUMENTS

| | | |
|---|---|---|
| 6,737,788 B2 | 5/2004 | Moler et al. |
| 6,759,790 B1 | 7/2004 | Bugel et al. |
| 6,789,087 B1 | 9/2004 | Sako |
| 6,834,419 B2 * | 12/2004 | Lopatin et al. ............ 29/25.35 |
| 6,836,056 B2 | 12/2004 | Oudshoorn et al. |
| 6,870,305 B2 | 3/2005 | Moler |
| 6,924,586 B2 | 8/2005 | Moler |
| 6,975,061 B2 | 12/2005 | Moler |
| 6,979,933 B2 | 12/2005 | Oudshoorn et al. |
| 7,040,349 B2 | 5/2006 | Moler et al. |
| 7,126,259 B2 | 10/2006 | Moler et al. |
| 7,132,781 B2 | 11/2006 | Moler et al. |
| 7,190,102 B2 | 3/2007 | VanderSluis |
| 7,258,533 B2 | 8/2007 | Tanner et al. |
| 7,261,352 B2 | 8/2007 | Maslov et al. |
| 7,368,856 B2 | 5/2008 | Moler et al. |
| 7,453,187 B2 | 11/2008 | Richards et al. |
| 7,560,856 B2 | 7/2009 | Chen et al. |
| 7,564,171 B2 | 7/2009 | Moler et al. |
| 7,638,929 B2 * | 12/2009 | Richter ............ 310/328 |
| 7,667,375 B2 | 2/2010 | Berkcan et al. |
| 7,687,977 B2 | 3/2010 | Xu |
| 2002/0109436 A1 | 8/2002 | Peng et al. |
| 2004/0263025 A1 | 12/2004 | Moler et al. |
| 2005/0116583 A1 | 6/2005 | Nishio et al. |
| 2006/0017349 A1 | 1/2006 | Moler et al. |
| 2008/0061031 A1 | 3/2008 | Hashiguchi et al. |
| 2008/0265712 A1 | 10/2008 | Ulm et al. |
| 2008/0315722 A1 | 12/2008 | Clingman et al. |
| 2009/0152990 A1 | 6/2009 | Brown et al. |
| 2010/0207411 A1 | 8/2010 | Sun et al. |

* cited by examiner

SMALL SCALE SMART MATERIAL ACTUATOR AND ENERGY HARVESTING APPARATUS

CROSS-REFERENCE TO RELATED APPLICATIONS

This application claims priority from U.S. provisional patent application Ser. No. 61/224,596 filed Jul. 10, 2009, which is herein incorporated by reference in its entirety.

BACKGROUND

The present invention relates to a small-scale piezo- or smart-material-actuator that can produce usable mechanical motion from electrical energy and can also serve to harvest electrical energy from mechanical motion or provide a voltage relative to force acted upon the device. Actuators of this type are known in the art. However, such devices are relatively large and are not well-suited to applications requiring very small components. In part, the difficulties in making very small actuators of this type derive from the desirability of applying a predetermined compressive force, or "pre-load," on the smart-material and the difficulty of making sufficiently small mechanical devices capable of creating such a pre-load. Further difficulties arise from the efficiency of multilayer co-fired piezo stacks that required larger stacks to generate a given level of actuator motion. The present invention corrects these shortcomings by providing more efficient actuators based on piezo- or smart-materials that may be manufactured in extremely small sizes.

SUMMARY

The present invention provides a micro-scale smart material actuator having a length preferably smaller than 10 mm. The actuator comprises a piezoelectric stack having at least one layer housed in a unitary mechanical amplifier. The mechanical amplifier comprises a fixed supporting member with a first mounting surface and a movable supporting member with a parallel and opposed second mounting surface, between which mounting surfaces, the piezoelectric stack is affixed. The mechanical amplifier also has at least one actuating arm connected to at least one compliant mechanical link connected to the movable supporting member. The fixed supporting member is substantially rigid such that, upon application of a suitable electric current to the piezoelectric stack, the piezoelectric stack expands substantially without movement of the fixed supporting member or angular movement of the piezoelectric stack. That expansion urges the movable supporting member away from the fixed supporting member, flexing the compliant mechanical links, and causing movement of the actuating arms, which may be amplified by the geometry of the mechanical amplifier such that the movement of the actuating arms is over a distance greater than the expansion of the piezoelectric stack. The fixed supporting member, movable supporting member and mechanical links are further adapted such that the piezoelectric stack remains partially compressed even when no electric potential is applied. The compressive force is substantially evenly applied to the stack such that it expands without substantial flexing when a current is applied.

Also disclosed is a method of generating electricity from motion with such a micro-scale actuator by connecting an electrical load to the piezoelectric stack and connecting the actuator arm to a source of mechanical motion. In this way, the motion causes movement of the actuator arm, whereby the mechanical links cause the movable supporting member to compress the piezoelectric stack. The compression generates an electrical current into the electrical load. In this way the actuator may be used to harvest energy in addition to creating motion. As the amount of electric potential generated is proportional to the degree of movement, a further method disclosed whereby such micro-scale actuator may be used as a sensor to determine small-scale movements.

BRIEF DESCRIPTION OF THE DRAWINGS

Features of the invention will become apparent from the attached drawings, which illustrate certain preferred embodiments of this invention, wherein.

DETAILED DESCRIPTION

This application hereby incorporates by reference U.S. Pat. Nos. 6,717,332; 6,548,938; 6,737,788; 6,836,056; 6,879,087; 6,759,790; 7,132,781; 7,126,259; 6,870,305; 6,975,061; 7,368,856; 6,924,586 and 7,564,171.

While the following describes preferred embodiments of this invention, it is to be understood that this description is to be considered only as illustrative of the principles of the invention and is not to be limitative thereof, as numerous other variations, all within the scope of the invention, will readily occur to others. The term "adapted" shall mean sized, shaped, configured, dimensioned, oriented and arranged as appropriate.

Figure 1:
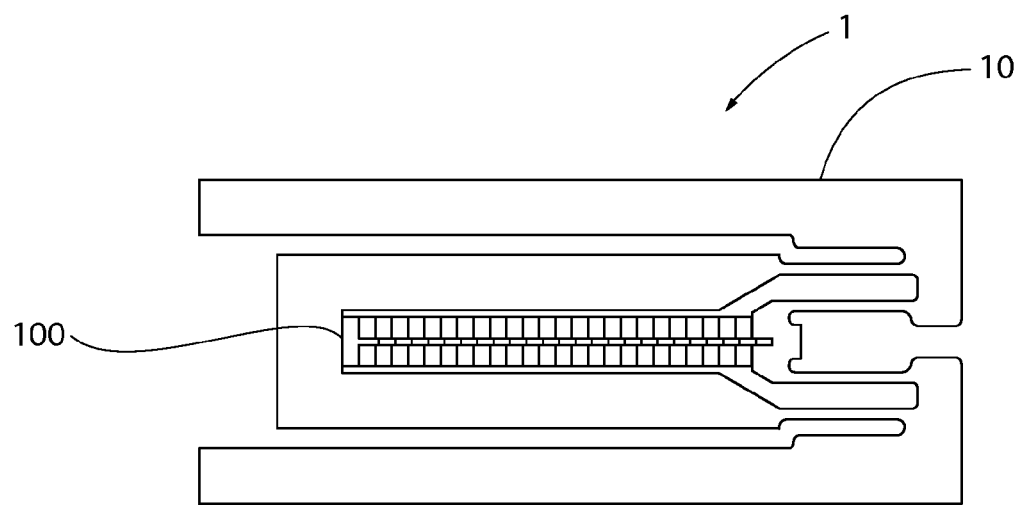
FIG. 1 shows a side view of a preferred embodiment of the apparatus of the present invention having a multilayer piezoelectric stack.
Figure 2:
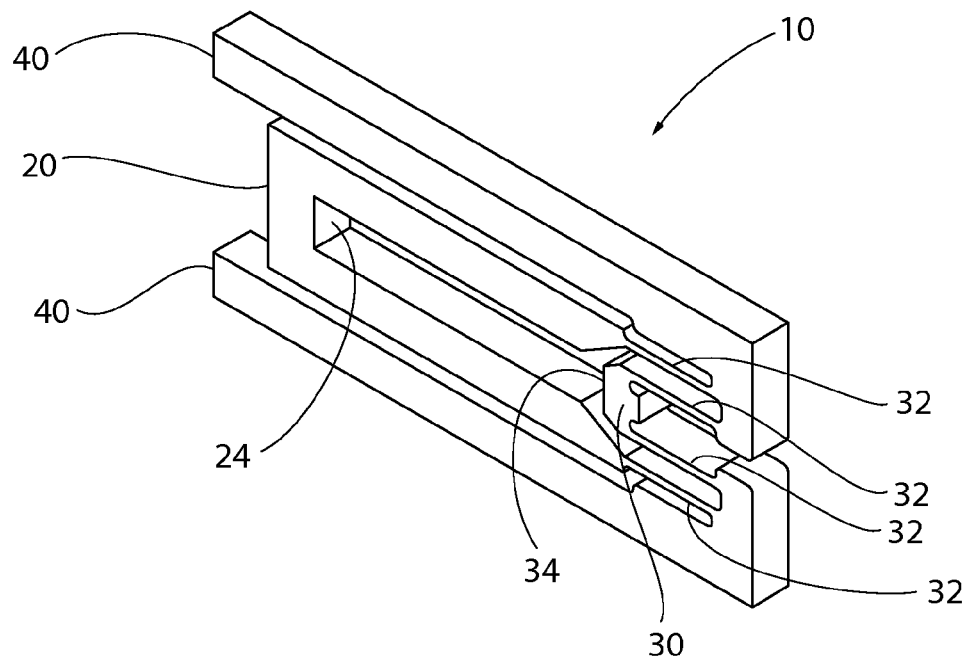
FIG. 2 shows an isometric view of a preferred embodiment of a mechanical amplifier suitable for use with the apparatus of the present invention.

FIG. 1 illustrates a preferred embodiment of the micro-scale material actuator apparatus 1 of the present invention, with FIG. 2 illustrating an isometric view of the mechanical amplifier of actuator 1. The overall length of the actuator may conveniently be 10 mm or less, allowing for use in a variety of applications where larger sized actuators are impractical. Utilizing the structures and methods of the present invention, actuators substantially smaller than 10 mm are also possible, with actuators having a length of 1 mm or less being practical.

Actuator 1 comprises a unitary mechanical amplifier 10 and piezoelectric stack 100. While mechanical amplifiers of larger-sized actuators may be assembled from discrete components, in order to achieve the small sizes of the actuator 1 of the present invention, it is preferred that the mechanical amplifier 10 be unitary, meaning that it is formed from a single piece of material. That material may be a metal such as stainless steel, from which high-precision laser cutting or chemical etching is used to cut the shape of mechanical amplifier 10. In alternate embodiments, mechanical amplifier 10 may be formed from silicon via the etching process traditionally used to form semiconductors, thereby leading to even smaller actuator bodies. Other materials such as carbon fiber, plastics, or ceramics may also be used, depending on the application. Stainless steel is one preferred material as it allows for an appropriate level of stiffness and durability, and also may be formed in a manner that creates useful working surfaces (such as blades) integrally formed in convenient locations on mechanical amplifier 10.

A preferred embodiment of mechanical amplifier 10 comprises fixed supporting member 20 having first mounting surface 24. Fixed supporting member 20 serves the purpose of rigidly supporting piezoelectric stack 100 with a suitable preload compression as is discussed further below. First mounting surface 24 is preferably shaped to connect firmly and evenly with piezoelectric stack 100, with an optional insulator 101 (shown on FIG. 4), as is discussed further below. Firm and even mating between mounting surface 24 and piezoelectric stack 100 is desirable as it acts to minimize angular flexing of piezoelectric stack 100 during operation, thereby improving the operational lifetime and efficiency of actuator 1.

Mechanical amplifier 10 further comprises opposed movable supporting member 30, which has second mounting surface 34. Piezoelectric stack 100 is affixed between first mounting surface 24 and second mounting surface 34. While adhesives may be used to secure piezoelectric stack 100, in certain embodiments such adhesives are not necessary as the compressive force supplied by movable supporting member 30 pressing piezoelectric stack 100 against first mounting surface 24 of fixed supporting member 20 will generally be sufficient to secure piezoelectric stack 100 in place. It is accordingly convenient for fixed supporting member 20 to be substantially rigid and for movable supporting member 30 and second mounting surface 34 to be parallel and directly opposed to fixed supporting member 20 and first mounting surface 24. As with first mounting surface 24, it is desirable that second mounting surface 34 be adapted to meet piezoelectric stack 100 firmly and evenly. In this way, upon application of a suitable electrical potential to piezoelectric stack 100, piezoelectric stack 100 will expand substantially without angular movement caused by flexing, thereby allowing for longer duty cycles and more efficient operation.

The illustrated embodiment of actuator 1 further comprises actuating arms 40, which are joined with fixed supporting member 20 and movable supporting member 30 by mechanical links 32. Mechanical links 32 are compliant and adapted such that urging movable supporting member 30 away from fixed supporting member 20 will cause mechanical links 32 to flex, thereby causing actuator arms 40 to move toward one another. The longer actuating arms 40 are, the greater the movement at their ends. Accordingly, the design of mechanical amplifier 10 amplifies the mechanical motion created by piezoelectric stack 100 into greater mechanical motion at the ends of actuator arms 40. In this way, actuator 1 may be activated by applying an electric potential to piezoelectric stack 100, thereby causing it to expand and urge second movable supporting member 30, which causes corresponding but amplified movement of actuator arms 40. As is discussed further below, reverse operation is also possible in which at least one actuator arm 40 is moved by a mechanical force, thereby causing movable supporting member 30 to alternately compress and expand piezoelectric stack 100, which in turn causes piezoelectric stack 100 to generate an electric potential which can then be discharged into an electrical load such as a rechargeable power source (not shown). Accordingly, it is understood that actuator 1 may be used as an actuator that creates mechanical motion from electrical energy by applying an appropriate electrical potential to piezoelectric stack 100, or as a generator that harvests electrical energy from mechanical motion by attaching actuator arms 40 to a source of mechanical energy such as a muscle fiber or a vibrating or oscillating device, and then discharging the electric potential created by the expansion and compression of piezoelectric stack 100 into an energy storage device such as a rechargeable battery or a capacitor.

The amount of electric potential (or voltage) generated by piezoelectric stack 100 will be proportional to the amount of movement of actuator arm(s) 40. Accordingly, by analyzing the amount of energy harvested, the degree of movement of actuator arms 40 can be determined. Accordingly, also disclosed herein is a method of sensing motion with a microscale smart material actuator 1 by connecting actuator arm or arms 40 to a source of mechanical motion and reading the voltage generated by piezoelectric stack 100. That voltage may then be used to indicate the amount of movement experienced by actuator arms 40 as the electric potential generated will be proportional to the amount of movement. In this way, the degree of motion can be sensed either at a given instant, or over a period of time. Because of the small size of actuator 1, very small movements can be reliably sensed. Applications for such sensors are myriad and include, without limitation, micro-scale bio sensors measuring small amounts of motion in a body and measuring small scale vibrations in mechanical devices. Amplification and signal processing may be required to translate the signal generated by such a sensor into usable information. Such amplification and signal processing means, however, are well understood in the art and need not be discussed further herein.

If mechanical amplifier 10 is formed from an electrically conductive material such as metal, it is convenient to insert an insulator 101 (shown on FIG. 4) between at least one end of piezoelectric stack 100 and either first mounting surface 24 or second mounting surface 34. This enables the body of mechanical amplifier 10 to be electrically connected to one pole of piezoelectric stack 100, serving, for example, as a ground. In the event piezoelectric stack 100 is adapted such that both first mounting surface 24 and second mounting surface 34 connect to sections of piezoelectric stack 100 having the same polarity, or if mechanical amplifier 10 is formed from a non-conductive material, insulators 101 are not needed.

It will be understood by those of skill in the art that while the operational dynamics of mechanical amplifier 10 constrain the design of fixed supporting member 20, movable supporting member 30 and mechanical links 32, actuating arms 40 may be formed in a wide variety of sizes and configurations depending on the desired application for actuator 1. For example, and without limitation, there may be only a single actuating arm 40 with the opposite actuating arm 40 replaced with a mounting surface (not shown) adapted for attachment to a fixed surface (not shown); actuating arms 40 may be angled away from piezoelectric stack 100, may be curved, or may have integral features such as blades, barbs, points, or mechanical attachments. In one possible embodiment, actuating arms 40 extend beyond the end of fixed supporting member 20 and have integral blades (not shown). In this way, repeated activation and deactivation of piezoelectric stack 100 causes a scissor-like cutting action usable in a micro-sized surgical device. Similarly, by incorporating barbs or other suitable features to actuating arms 40, actuator 1 could be placed in muscle tissue or other moving part of an animal or human in order to harvest electrical energy from movement. Different actuating arm features could similarly be used to capture electrical energy from fluid or gas flow within a body.

It will be further understood that while longer actuator arms 40 will result in greater stroke of actuator 1, that stroke will be with less force. If greater force is needed and less stroke length is acceptable, shorter actuating arms 40 may be used instead.

Figure 3:
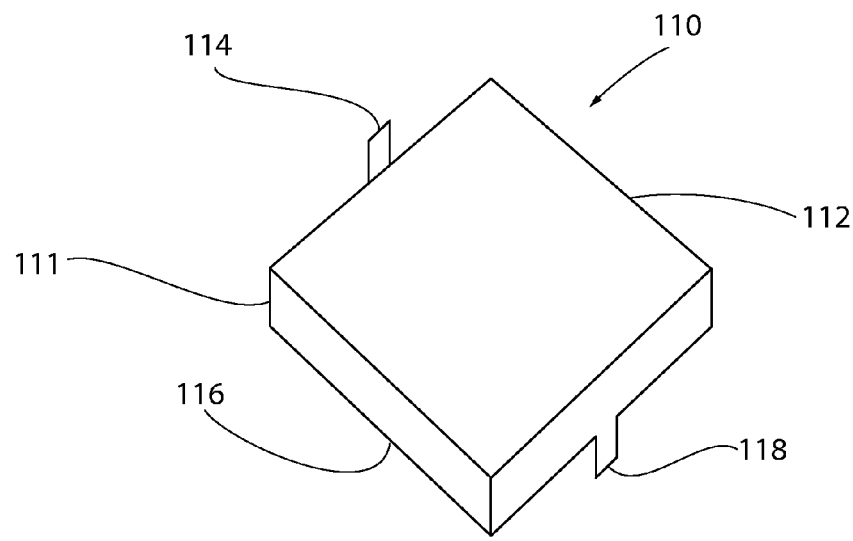
FIG. 3 shows an isometric view of a section of a preferred embodiment of a piezoelectric stack suitable for use with the apparatus of the present invention.
Figure 4:
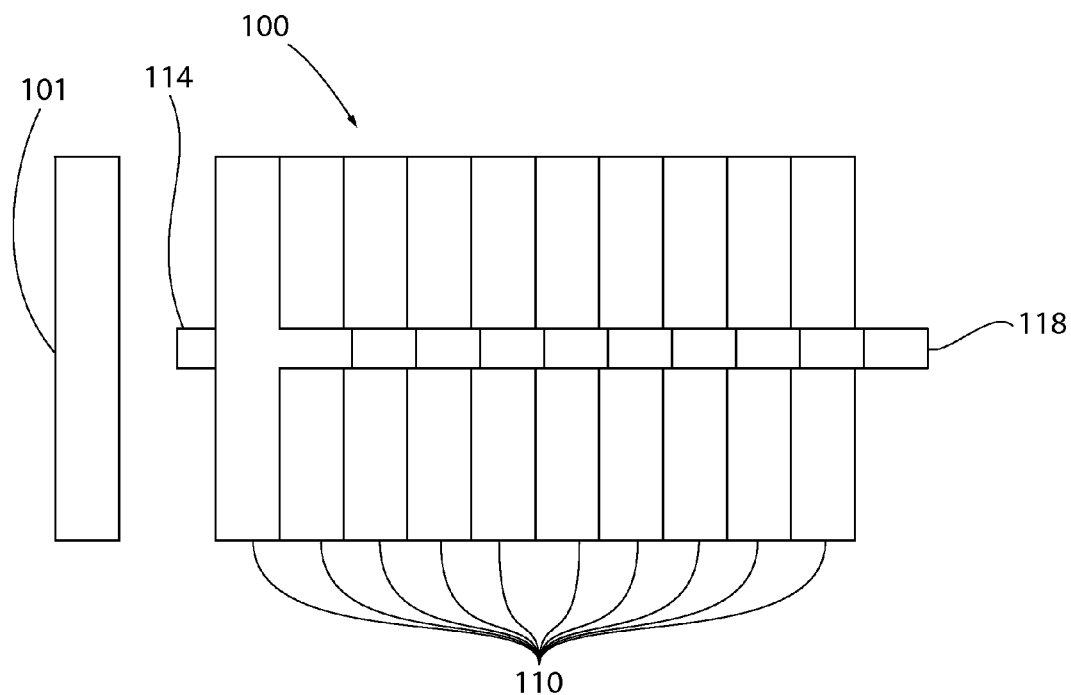
FIG. 4 illustrates a preferred embodiment of a multilayer piezoelectric stack suitable for use with the apparatus of the present invention and made up of the sections illustrated in FIG. 3.

Referring to FIGS. 3 and 4, Piezoelectric stack 100 is preferably formed of one or more sections of piezoelectric material 111 with a positive electrode 112 and a negative electrode 116. Many varieties of piezoelectric materials (materials that expand when an electric potential is applied or generate an electric charge when mechanical force is applied) are known in the art and may be adapted for use in the present invention. As discussed herein, the term piezoelectric material also includes so-called "smart materials," sometimes created by doping known piezoelectric materials to change their electrical or mechanical properties.

One type of piezoelectric stack 100 suitable for use in certain embodiments of actuator 1 of the present invention are multilayer piezoelectric stacks. Such stacks are known in the art and generally comprise sections 110 of piezoelectric material 111, each having opposing positive electrode 112 and negative electrode 116. Positive terminal 114 and negative terminal 118 may be used for convenient attachment of wires or conductive strips so that an electric charge can be applied and the sections 110 in a stack 100 may be electrically joined. Upon such application, piezoelectric material 111 will expand. Alternatively, upon compression of piezoelectric material 111, an electric potential will be created between electrodes 112 and 116. By stacking multiple layers together, the expansion and electrical harvesting characteristics are added together. By alternating the direction of piezoelectric sections 110 so that positive electrodes 112 are adjacent to positive electrodes 112, and negative electrodes 116 are adjacent to negative electrodes 116 when stacked, insulators between sections 110 are not needed. Where the piezoelectric stack 100 is inserted into a conducting structure (such as a mechanical amplifier formed of metal), it may be necessary to include an insulator 101 on one end. If, however, piezoelectric stack 100 is configured such that the terminals 114, 118 at each end are the same polarity (i.e. by having an even number of alternately stacked sections 110), then no insulator 101 is needed.

One type of multilayer piezoelectric stack 100 suitable for use with the present invention is a co-fired, multilayer ceramic piezoelectric stack. Such piezoelectric stacks may be formed by printing electrodes on either end of a ceramic piezoelectric material 111 using known techniques. The layers are then stacked and fired together to create a unitary structure. Such stacks are available from a number of suppliers, including NEC. Such stacks are convenient for use in actuators 1 having dimensions on the order of 2 mm in length, 0.5 mm to 1 mm in thickness and 1 mm in width. As will be understood by those of skill in the art, this is only one example and many different stack sizes can be formed using different numbers of layers, and different layer thicknesses, thereby providing for actuators suitable for a wide variety of applications.

Figure 6:
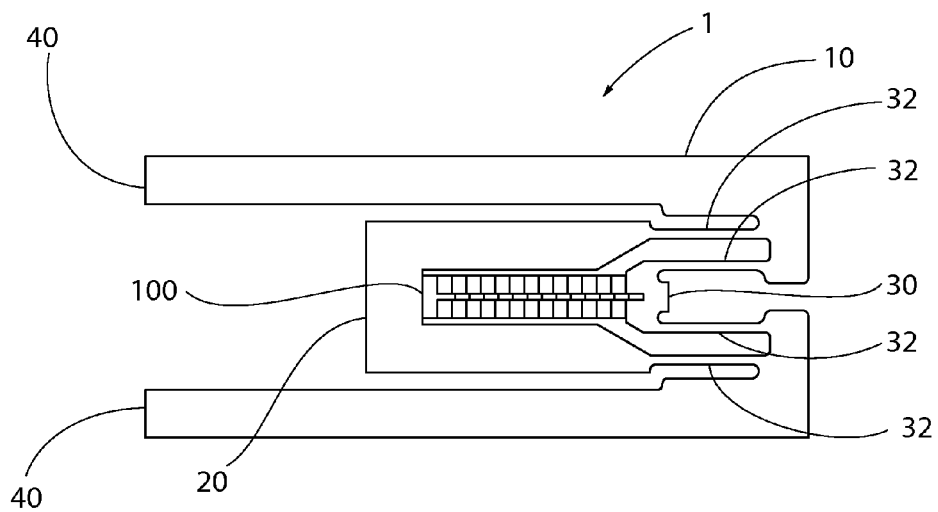
FIG. 6 illustrates an alternate embodiment of a mechanical amplifier suitable for use with the apparatus of the present invention having a single-crystal piezoelectric stack.

Another type of multilayer piezoelectric stack 100 suitable for use with the present invention is a stack 100 formed of sections 110 of a single-crystal piezo material. Single crystal piezo materials are known in the art and can be created in a variety of configurations. Single crystal piezo materials are generally thought to be more efficient than co-fired ceramic materials. As such, less material may be used to generate effects comparable to larger co-fired stacks. Piezoelectric stacks 100 formed of single-crystal piezoelectric materials may conveniently be used in even smaller embodiments of actuators 1 of the present invention, including sizes, for example, of 1 mm in length (the lengthwise axis being the axis along which the crystal predominantly expands upon application of an electric current to the crystal), and 0.3 mm square. As is shown in FIG. 6, when shorter stacks 100 are used, actuator arms 40 may extend well beyond fixed supporting member 20. Once again, it will be clear to those of ordinary skill in the art that many different sizes, including both larger and smaller sizes, may be created using such stacks.

In forming stacks of single crystal material, it can be desirable to use a conducting or insulating adhesive between the layers to add to the structural strength of the stack. In this way, when inserted into actuator 1, stack 100 will be held together both by the compressive forces created by fixed supporting member 20 and movable supporting member 30 and by the adhesive between the layers. Similarly, adhesive may be used between stack 100 and mounting surfaces 24, 34 to hold stack 100 in place as well as, or instead of, forming mounting surfaces 24, 34 with structural features such as ridges or tabs adapted to hold stack 100 in place.

Piezoelectric stack 100 will benefit from being compressed by a predetermined amount, thereby creating a preload, such that the piezoelectric stack 100 remains compressed when no electric potential is applied. Any such compressive force should be substantially evenly applied such that upon application of an electric potential, the piezoelectric stack 100 expands without substantial angular flexing. Reducing flexing both increases the efficiency of stack 100 and also increases its operational life.

Determining the proper level of predetermined compression, or preload, may be accomplished by applying different preload levels, and for each preload level, plotting the stroke at various blocking force levels. The preload level for which the integral of such curve for the required stroke and blocking force level is maximized is preferred.

Figure 5:
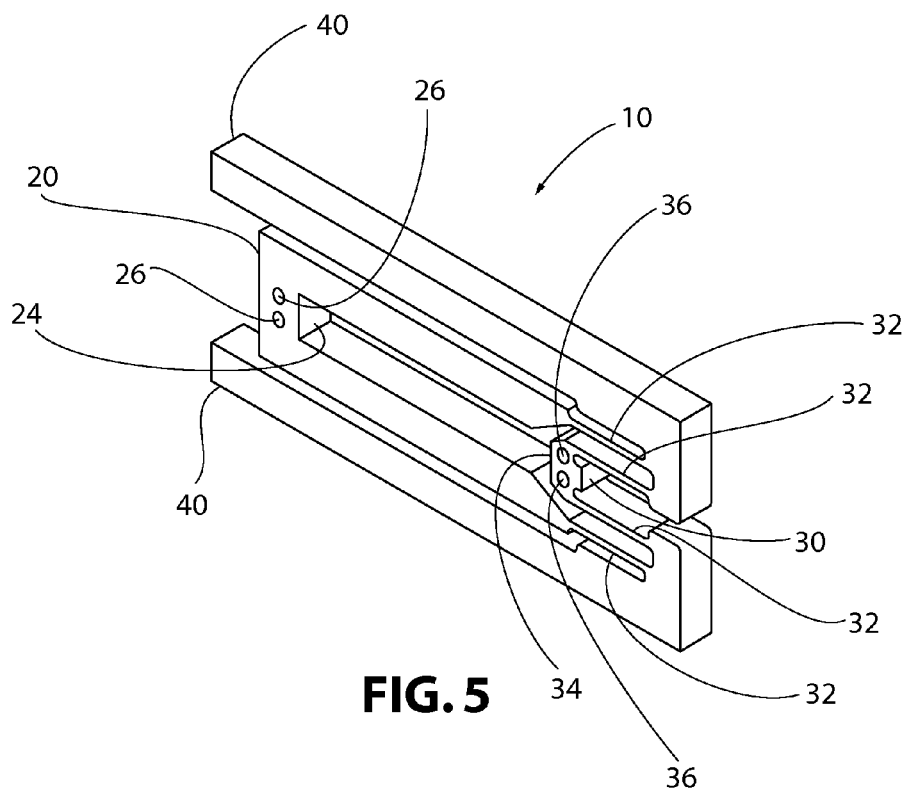
FIG. 5 illustrates an alternate embodiment of a mechanical amplifier suitable for use with the apparatus of the present invention.

On larger actuators, preload may be achieved by incorporating a threaded bolt or means of mechanical compression into movable supporting member 30 or fixed supporting member 20. In very small actuators, such mechanical compression means can become impractical. Accordingly, embodiments of the actuator of the present invention may conveniently rely on the spring rate of mechanical links 32 to provide the needed preload. By determining the necessary preload level and resulting compression of stack 100, mechanical amplifier 10 may be designed with mechanical links 32 adapted such that when actuating arms 40 are in the desired starting position, the appropriate preload results on stack 100 by virtue of the spring rate of the mechanical links 32, thereby eliminating the need for unwieldy mechanical compression mechanisms. In such embodiments, actuating arms 40 may be angled away from fixed supporting member 20 to a greater degree before insertion of piezoelectric stack 100. In such embodiments, piezoelectric stack 100 may be inserted by compressing actuating arms 40, inserting stack 100, and then releasing actuating arms 40. As is shown in FIG. 5, an alternate installation method may be used by forming preferably 2 holes 26 in fixed supporting member 20 and another 2 holes 36 in movable supporting member 30. In this way a tool (not shown) having 4 pins adapted to be captured by holes 26, 36 may be used to urge first mounting surface 24 and second mounting surface 34 apart a sufficient amount to allow for the insertion of stack 100. By forming holes 26, 36 in a rectangular pattern, the force applied by such tool will be applied evenly so that undesirable twisting is minimized.

Where the spring rate of mechanical links 32 are used for compressive force, and the size of mechanical amplifier 10 is small, it is important that mechanical links 32 are adapted such that they do not reach their yield point during normal operation, and such that piezoelectric stack 100 does not go into an uncompressed state during such operation. The yield point of mechanical links 32 will be reached if they are flexed to a point where they do not thereafter return to their starting position. If the yield point is exceeded during operation, stroke will be affected. The level of preload may also change, thereby reducing efficiency. Preventing piezoelectric stack 100 from attaining an uncompressed state is similarly important as the life of such stacks may be significantly reduced if they are operated in an uncompressed state for reasons including that cracking is more likely to occur. As will be understood by those of skill in the art, by determining the required stroke and force needed, and then selecting an appropriate stack 100 capable of generating such force, it is possible to design mechanical links 32 to provide a preferred level of preload and, in combination with actuating arms 40, a preferred level of mechanical amplification to achieve a desirable stroke/force combination, while preventing stack 100 from going into an uncompressed state during normal operation. Different materials having different spring rates will, accordingly, require different configurations of mechanical amplifier 10 to achieve comparable results.

It will be readily understood that actuators of the present invention have many useful applications. For example, and without limitation, blades may be formed on actuating arms 40, thereby creating a cutting device useful in endoscopic surgical applications where a very small blade is needed to cut tissue, for example, to open a blocked artery or remove a small clot or tumor. Another example, also without limitation, would be to adapt actuator 1 to serve as an energy harvester by adapting actuating arms 40 to attach to a source of mechanical motion such a muscle in an animal or human or to be flexed in a turbulent environment such as within a fluid stream inside an artery or a gas stream inside an air passage. In this way, the mechanical energy generated when stack 100 is repeatedly compressed and released by actuating arms 40 may be harvested by discharging the current into an electrical load such as an energy storage device. In this way, for example, excess mechanical energy could be converted into electrical energy that is then stored (i.e. in a rechargeable battery). That electrical energy could then be used to assist in, for example driving a pacemaker, biosensor, or other bio-embedded, electrically driven device.

While the present invention has been described in conjunction with what are presently considered to be the most practical and preferred embodiments, this invention is not limited to those embodiments, but instead is intended to encompass all of the various modifications to, and variations on those embodiments, and all equivalent arrangements, within the scope and spirit of the appended claims, which scope is to be accorded the broadest interpretation permitted under law.

I claim:

1. A method of generating electricity from motion with a micro-scale smart material actuator having an overall length smaller than 10 millimeters, said actuator comprising
   a unitary mechanical amplifier comprising a fixed supporting member having a first mounting surface, an opposed movable supporting member having a second mounting surface, at least one actuating arm, and a mechanical link connecting said movable supporting member and said actuating arm; and a piezoelectric stack affixed between said first mounting surface and said second mounting surface, wherein
   said fixed supporting member is substantially rigid and said first mounting surface and said second mounting surface are substantially parallel such that upon application of an electrical potential to said piezoelectric stack, said piezoelectric stack expands substantially without movement of said fixed supporting member and substantially without angular movement of said piezoelectric stack;
   said mechanical link comprises at least one compliant member linking said movable supporting member and said actuating arm whereby movement of said movable supporting member causes amplified movement of said actuating arm; and
   said fixed supporting member, said movable supporting member and said mechanical link are adapted such that said piezoelectric stack is compressed by a predetermined amount such that said piezoelectric stack remains compressed when no electric potential is applied and said compressive force is substantially evenly applied to said piezoelectric stack such that upon application of an electric potential, said piezoelectric material expands without significant angular flexing,
said method comprising the steps of
embedding said actuator in the body of an animal;
connecting an electrical load to said piezoelectric stack of said actuator and
connecting said actuator arm to a source of mechanical motion
whereby said source of motion causes said actuator arm to move, whereby said mechanical link causes said movable supporting member to exert and release pressure on said piezoelectric stack, thereby causing said piezoelectric stack to generate an electric current into said electric load.

2. The method of claim 1 wherein said mechanical motion is motion produced by the operation of muscle tissue of said animal.

3. The method of claim 1 wherein said mechanical motion is motion produced by the pumping of fluids in the body of said animal.

4. The method of claim 1 wherein said mechanical motion is producing the passage of gasses in the body of said animal.

5. The method of claim 1 wherein said animal is a human.

6. The method of claim 1 wherein said electrical load is an energy storage device.

7. The method of claim 6 wherein said energy storage device is a rechargeable battery.

8. The method of claim 1 wherein said predetermined compression amount is the amount of compression force required to generate the maximum work for a predetermined stroke length of said actuating arm.

* * * * *